US012781333B2

(12) United States Patent
He et al.

(10) Patent No.: US 12,781,333 B2
(45) Date of Patent: Nov. 3, 2026

(54) COATING FOR PERFORMANCE ENHANCEMENT OF SEMICONDUCTOR APPARATUS

(71) Applicant: Advanced Micro-Fabrication Equipment Inc. China, Shanghai (CN)

(72) Inventors: Xiaoming He, Shanghai (CN); Li Zhang, Shanghai (CN); Xingjian Chen, Shanghai (CN); Tuqiang Ni, Shanghai (CN); Zhaoyang Xu, Shanghai (CN)

(73) Assignee: ADVANCED MICRO-FABRICATION EQUIPMENT INC. CHINA, Shanghai (CN)

(*) Notice: Subject to any disclaimer, the term of this patent is extended or adjusted under 35 U.S.C. 154(b) by 511 days.

(21) Appl. No.: 16/517,491

(22) Filed: Jul. 19, 2019

(65) Prior Publication Data

US 2019/0338408 A1 Nov. 7, 2019

Related U.S. Application Data

(62) Division of application No. 14/065,323, filed on Oct. 28, 2013, now abandoned.

(30) Foreign Application Priority Data

Oct. 29, 2012 (CN) ......................... 201210421964.4

(51) Int. Cl.
*C23C 14/22* (2006.01)
*C23C 14/02* (2006.01)
(Continued)

(52) U.S. Cl.
CPC ............ *C23C 14/028* (2013.01); *C23C 14/06* (2013.01); *C23C 14/0694* (2013.01);
(Continued)

(58) Field of Classification Search
None
See application file for complete search history.

(56) References Cited

U.S. PATENT DOCUMENTS 6,074,488 A * 6/2000 Roderick .............. H10P 72/722 118/728
2004/0040931 A1 * 3/2004 Koshiishi .......... H01J 37/32642 156/345.43
(Continued)

FOREIGN PATENT DOCUMENTS

EP 2497843 A1 * 9/2012 ........... C23C 14/086
JP 2004228500 A * 8/2004
(Continued)

OTHER PUBLICATIONS

Machine translation of JP-2004228500-A.*

*Primary Examiner* — David P Turocy
(74) *Attorney, Agent, or Firm* — Womble Bond Dickinson (US) LLP

(57) ABSTRACT

A plasma processing chamber having advanced coating for the showerhead and for an extended bottom electrode. The extended bottom electrode can be formed by one or more of the focus ring, cover ring, and plasma confinement ring. The extended electrode can be formed using a one-piece composite cover ring. The composite cover ring may be made of $Al_2O_3$ and include a $Y_2O_3$ plasma resistant coating. The plasma confinement ring may include a flow equalization ion shield that may also be provided with the plasma resistant coating. The plasma resistant coating of the extended electrode may have elements matching that of the showerhead.

18 Claims, 6 Drawing Sheets

(51) Int. Cl.

| | |
|---|---|
| ***C23C 14/06*** | (2006.01) |
| ***C23C 14/08*** | (2006.01) |
| ***C23C 14/32*** | (2006.01) |
| ***C23C 14/34*** | (2006.01) |
| ***C23C 14/58*** | (2006.01) |
| ***H01J 37/32*** | (2006.01) |

(52) U.S. Cl.
CPC ............ *C23C 14/083* (2013.01); *C23C 14/22* (2013.01); *C23C 14/32* (2013.01); *C23C 14/34* (2013.01); *C23C 14/5873* (2013.01); *H01J 37/32477* (2013.01); *H01J 37/32495* (2013.01); *H01J 37/32559* (2013.01); *H01J 37/32623* (2013.01); *H01J 37/32642* (2013.01); *Y10T 29/49888* (2015.01)

(56) References Cited

U.S. PATENT DOCUMENTS

| | | | | |
|---|---|---|---|---|
| 2005/0136188 | A1* | 6/2005 | Chang | C23C 4/04 156/345.52 |
| 2008/0202688 | A1* | 8/2008 | Wu | H01J 37/32541 156/345.34 |
| 2009/0214825 | A1* | 8/2009 | Sun | C23C 4/11 428/141 |
| 2012/0031426 | A1* | 2/2012 | Swami | C23C 16/4404 134/1.1 |
| 2014/0295670 | A1* | 10/2014 | Shih | C25D 11/026 438/758 |

FOREIGN PATENT DOCUMENTS

| | | | | | |
|---|---|---|---|---|---|
| JP | 2005240171 | A | * | 9/2005 | C04B 41/009 |
| KR | 200369552 | | * | 12/2004 | |
| TW | 200412827 | A2 | * | 7/2004 | |
| WO | WO-02054444 | A1 | * | 7/2002 | H01J 37/32009 |

* cited by examiner

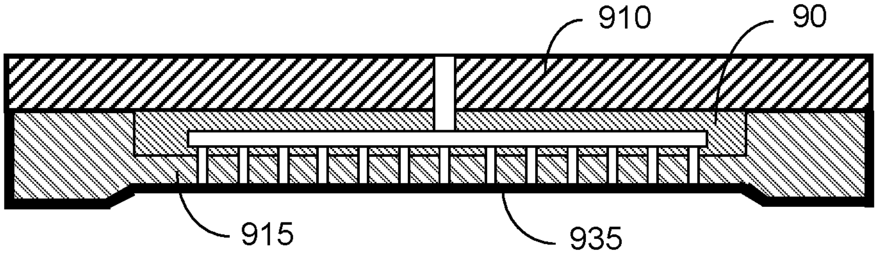
Fig. 9D
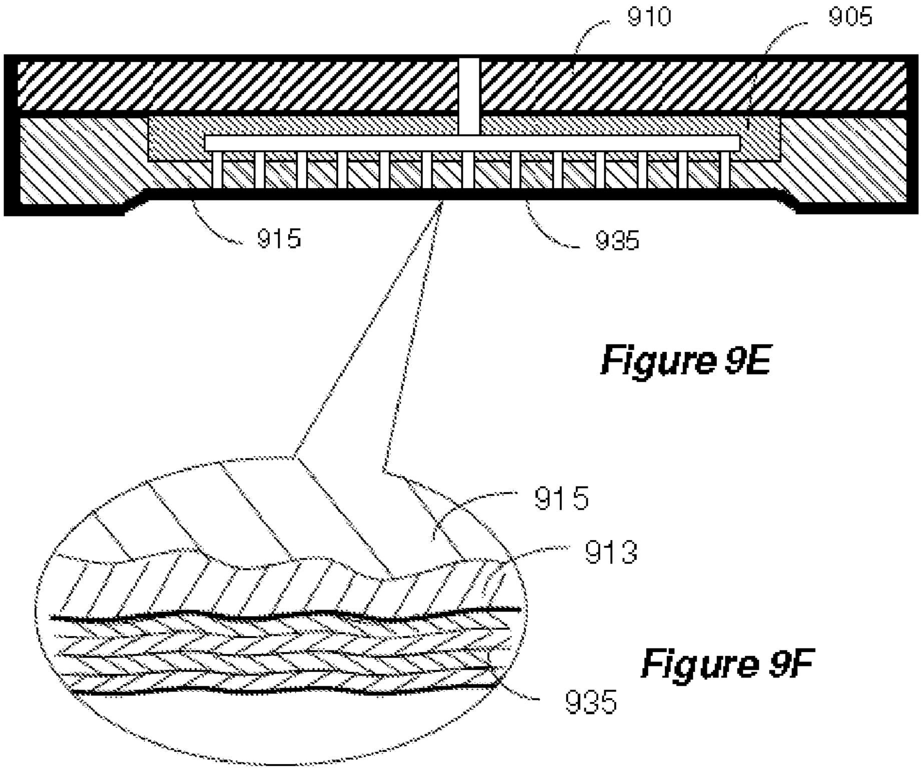
*Figure 9E*
*Figure 9F*

COATING FOR PERFORMANCE ENHANCEMENT OF SEMICONDUCTOR APPARATUS

This application is a divisional of U.S. patent application Ser. No. 14/065,323, filed on Oct. 28, 2013, which claims the priority to Chinese Patent Application No. 201210421964.4, filed on Oct. 29, 2012, which are incorporated by reference in their entireties herein.

BACKGROUND

1. Field

The subject invention relates to plasma processing chambers and, in particular, to chamber arrangements using coating for internal chamber parts, which enhance the performance of the plasma chamber.

2. Related Art

In plasma processing chambers, a showerhead is often used to inject the process gas. In certain plasma chambers, such as capacitively-coupled plasma chambers, the showerhead may also function as an electrode, coupled to either ground or RF potential. However, during processing the showerhead is exposed to the plasma and is attacked by the active species within the plasma, such as halogen plasma of $CF_4$, $Cl_2$, etc. This phenomenon is especially troublesome for showerheads having a chemical vapor deposited silicon carbide coating (CVD SiC).

Plasma chambers also utilize an electrostatic chuck, attached to a pedestal, to hold the substrate during processing. Generally, the diameter of the chuck and/or pedestal is larger than that of the substrate. Therefore, various additional elements are required to protect the chuck and/or pedestal from the active species in the plasma, and also to control the RF power coupling so as to sustain uniform plasma over the substrate. Such elements may include a focus ring, a cover ring, flow equivalent ion shied, and a plasma confinement ring, etc.

FIG. 1 is a schematic illustrating the general components of a capacitively-coupled plasma chamber. The chamber includes a chamber wall 100, ceiling 105, and floor 110, which together form a vacuum enclosure. A showerhead assembly 120 may include a gas distribution plate (GDP) 125, which can also function as an electrode; and a cover plate 127. The GDP 125 is shown grounded, and the cover ring 127 may also be conductive and grounded, generally by being in physical contact with the GDP 125.

The substrate 130 is held in place by chuck 135, which is attached to a pedestal 140. RF power is delivered to an electrode that may be embedded in the chuck 135 or may be part of the pedestal 140. A focus ring 140 is provided around the substrate and helps to control plasma uniformity. A cover ring 145 is provided around the focus ring and serves mainly for erosion protection from active plasma species. A plasma confinement ring 150 prevents plasma from igniting and/or sustaining below the plasma confinement ring 150, such that the plasma is confined to the processing zone of the vacuum enclosure.

As is known, during processing the plasma may be rather corrosive to the various elements of the chamber, especially the showerhead, since it forms a part of the capacitive RF power circuit. Therefore, various coatings have been proposed and tested in the prior art for protecting the showerhead from plasma erosion. Yttria ($Y_2O_3$) coating is believed to be promising; however, it has been very difficult to find a process that results in good coating, especially one that does not crack or generate particles. For example, there have been proposals to use plasma spray (PS) to coat a showerhead made of metal, alloy or ceramic. However, conventional PS $Y_2O_3$ coating is formed by the sprayed $Y_2O_3$ particles, and generally results in a coating having high surface roughness (Ra of 4 micron or more) and relatively high porosity (volume fraction is above 3%). The high surface roughness and porous structure makes the coating susceptible to generation of particles, which may contaminate the wafer being processed. In addition, the particle will come out from the gas holes and dropped on the wafer when the as-coated shower head is used in the plasma process, as the plasma sprayed coating inside the gas hole is very rough and has poor adhesion to the substrate.

Other proposals for forming Yttria coating involve using chemical vapor deposition (CVD), physical vapor deposition (PVD), ion assisted deposition (IAD), active reactive evaporation (ARE), ionized metal plasma (IMP), sputtering deposition and plasma immersion ion process (PIIP). However, all these deposition processes have some technical limitations such that they have not been actually used to scale up for the deposition of thick coating on the chamber parts for the plasma attack protections. For instance, CVD of $Y_2O_3$ can not be carried out on substrates that cannot sustain temperatures above 600° C., which excludes the deposition of plasma resistant coating on chamber parts that are made of aluminum alloys. PVD process, such as evaporation, can not deposit dense and thick ceramic coating because of their poor adhesion to substrate. Other deposition processes can not deposit thick coating either due to the high stress and poor adhesion (such as sputtering deposition, ARE and IAD) or the very low deposition rate (such as sputtering deposition, IMP and PIIP). Therefore, so far no satisfactory coating has been produced, that would have good erosion resistance, while generating low or no particles and can be made thick without cracking or delamination.

Moreover, when the showerhead assembly, e.g., showerhead and ground ring, is coated or replaced by a one piece $Y_2O_3$ coated SiC showerhead, the RF coupling between the upper electrode and the bottom electrode is maintained between $Y_2O_3$ and silicon surfaces (i.e., wafer) or between $Y_2O_3$ showerhead and silicon wafer and SiC focus ring surface. Consequently, the RF induced plasma distribution on the wafer is quite different from the plasma distribution on wafer when uncoated SiC showerhead is used.

FIG. 2 is a plot of etch rate (ER) over the surface of silicon wafer using SiC showerhead (diamonds plot) and using $Y_2O_3$ coated showerhead (triangle plot). The plots of FIG. 2 clearly demonstrate that the use of $Y_2O_3$ showerhead (SH) induces an ER distribution having a much higher etch rate than the ER distribution that is created using an uncoated SiC showerhead. However, the ER drops at the wafer edge area, which induces an increased non-uniformity of the ER over the wafer surface. As can be seen from FIG. 2, the ER uniformity variation for $Y_2O_3$ coated showerhead is 10.74%. The increase of non-uniformity limits the application of $Y_2O_3$ coated showerhead (SH) to actual etching process. Similar thing happens in the case where only a $Y_2O_3$ coated SiC showerhead (SH) is used, which indicates the important and sensitive impact of the electrode's surface or surface materials on the ER distributions over the wafer in various plasma chemical etching processes.

In view of the above-described problems in the art, a solution is needed for a showerhead coating that resists plasma species attack and does not generate particle or cracks. The coating should have acceptable roughness and porosity values, so that it could provide long service life. Additionally, the solution should maintain ER uniformity over the wafer. The process for fabricating the coating should allow thick coating without being susceptible to cracking or delamination.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to an aspect of the invention, methods are provided for the formation of advanced plasma resistant coatings on showerheads. According to various embodiments, the process of the coating the showerhead surface is provided so that the service performance of the coated showerhead is improved. Other embodiments involve the modification and installation of the coated showerhead into the plasma chamber, so as to improve the plasma process quality.

According to various embodiments, etch uniformity is maintained, while the showerhead is protected by an effective $Y_2O_3$ coating. In one example, a hardware configuration of a capacitively coupled plasma (CCP) chamber is provided where at least the perforated plate of the showerhead is coated with $Y_2O_3$, while at least one opposing conductive surface of the CCP is also coated with $Y_2O_3$. The opposing surface may be any one or a combination of focus ring, cover ring, flow equivalent ion shied, and/or plasma confinement ring. In one embodiment, the perforated plate and ground ring are replaced by a one-piece equivalent plate, which is made of conductive material, e.g., SiC or Al alloy, and has a protective coating, e.g., Yttrium-based coating, such as $Y_2O_3$. To maintain good plasma uniformity, the opposing surface is also coated. For example, the focus ring and cover ring are coated using the same coating as the showerhead. In some examples, the focus ring and cover ring are combined into a single equivalent ring which is coated. Also, if either is used, the plasma confinement ring or the flow equivalent ion shield can be coated.

In an exemplary process, an advanced Yttria coating, e.g., $Y_2O_3$ or $YF_3$ based coatings, with fine/compact grain structure and random crystal orientation is created by a plasma enhanced physical vapor deposition (PEPVD) process, in which (1) the deposition is carried out in a low pressure or vacuum chamber environment; (2) at least one deposition element or component is evaporated or sputtered out off a material source and the evaporated or sputtered material condenses on the substrate surface (this part of the process is a physical process and is referred to herein as the physical vapor deposition or PVD part); (3) meanwhile, a plasma source (or sources) is (are) used to emit out ions and to generate plasma that surrounds the showerhead surface and at least one deposition element or component is ionized and reacted with the evaporated or sputtered elements or components in plasma or on the surface of the showerhead; and (4) the showerhead is coupled to a negative voltage, such that it is bombarded by the ionized atoms or ions during the deposition process. The actions from (3) and (4) are referred to as the "plasma enhanced (PE)" function of the PEPVD.

It should be mentioned that the plasma source(s) could be used either (1) to ionize, decompose, and activate the reactive gases so that the deposition process can be performed in a low substrate temperature and with a high coating growth rate as more ions and radicals are generated by plasma, or (2) to generate the energetic ions aimed at the showerhead so that the ion impinges on the surface of the shower head and helps to form the thick and dense coatings thereon. More perfectly, the plasma sources will be used as the alternative or the combinations of functions (1) and (2), to lead the formation of the coating on the shower head. Such a coating synthesized with the enough thickness and the dense structure is generally referred to herein as "advanced coating" (referred to A-coating herein), for instance, such as A-$Y_2O_3$, A-$YF_3$, or A-$Al_2O_3$ based coatings.

In order to improve the coating formation, the deposition of A-coating is performed on a roughened surface of the substrates or showerhead, to improve the adhesion of the coating to substrate and to increase the deposition thickness. This is because the increase of surface roughness of the material increases the contact area in the interfacial region between the coating and substrate surface, and changes of the coating contact area from more 2-dimensional fraction to more 3-dimensional fraction. The deposition on the rough surface induces the formation of coating with random crystal orientation and results in the release of the interfacial stress between the A-coating and the substrates, which enhances the coating adhesion to the substrate and promotes the formation of thick and dense coating thereon. It has been expected that the improved stability of A-coating on materials surface can be reached if the coating is deposited on materials with the surface roughness at least above 4 um.

In order to reduce the production cost, another embodiment involves the formation of double layered coating combinations in which the first layer or coating is formed on the showerhead base as the anodization, the plasma spray $Y_2O_3$, or other plasma resistant coatings, with a certain thickness designed to maintain the required electrical properties of the formed showerhead and the first layer has the surface roughness above 4 um. A second layer or coating is formed over the first layer that is at least 4 um in roughness and the second layer or coating thus has a top surface facing to plasma in the plasma processes. The second coating can be formed as the A-coating (e.g. A-$Y_2O_3$, A-$YF_3$, etc.), and the formed coatings have the specified roughness (surface roughness $Ra \leq 1.0$ um) and dense structure with random crystal orientation and with a porosity less than 1% or without porous defects. Consequently, particle contamination, which is usually induced by plasma spray coating due to the rough surface and porous structure, can be reduced, while A-coating is used as the showerhead exterior surface. In addition, due to the dense crystal structure, the second coating has reduced plasma erosion rate, which could further reduce metal contamination in the plasma processes. The thicknesses of either the first coating or the second coating can be adjusted according to the performance requirement on the showerhead.

In another embodiment, the showerhead surface is coated by double layered coating combinations, in which the first layer or coating is formed on the showerhead base by anodization, by plasma spray, or by other technologies, and with enough thickness to provide the desired process functions of the showerhead in the plasma processes (such as required electrical conductivity, thermal conductivity or thermal barrier function, and other functions). The second layer or coating is formed on the first layer or coating to form a top surface facing the plasma in the plasma etch processes. The first layer or coating could be either plasma resistant or other function coatings with or without uniform distribution in thickness and/or composition on the showerhead base surface. The second coating is the A-coatings, such as A-$Y_2O_3$ coating. Since the A-coating has the specified roughness (Ra≤1.0 um) and dense structure with random crystal orientation and with a porosity less than 1% or without porous defects, the A-coating has plasma erosion rate much lower than the first coating, which would not create particles and should have reduced metal contamination in the plasma processes. The thicknesses and the roughness of either the first coating or the second coating can be adjusted according to the performance requirement on the showerhead.

In another embodiment, the multi-layered coatings are deposited on the showerhead, such that the coated showerhead has an increased coating thickness, a stable surface facing the plasma chemistry, and the desired functions to improve the process performance of the plasma chamber. As different from the coating that is deposited as a single layered structure, the same material with the multilayered structure can be deposited to reach an increased thickness with a reduced risk of crack formation, as the increased interfacial areas due to the multi-layers can release the coating stress that is usually increased with the increase of the layer or coating thickness. The multilayered coating is composed by either the multilayered A-coatings or the combination of the multi-layered functions coating with the multi-layered A-coatings whose top layer faces the plasma, for instance, when the coatings are deposited on the showerhead. It has been confirmed that the multi-layered A-coating with random crystal orientation can be deposited on the showerhead to thicknesses above 50 um without cracking and delamination if the showerhead has a surface roughness above 4 um.

In another embodiment, in order further to improve the performance of the coating packaged showerhead, surface processes are applied on the as-coated showerhead, which includes, but not limited to, surface smoothening or roughening to reduce the particles, surface modification to enhance the surface density and stability of the coatings, and surface chemical cleaning to remove the particles and contamination that are formed on the coated showerhead either due to the coating deposition process or due to the plasma etching process.

According to one aspect, the surface roughness of the A-coating is controlled, since if the surface is too smooth, polymer deposition during etching will not adhere well to the surface, and thus induce particles. On the other hand, too rough surface will directly create particles due to the plasma etching. The recommended surface roughness is at least 1 um or above for the A-coatings, which can be reached by the adjustment of the substrate roughness, by the deposition process, or by lapping, polishing and other post surface treatment on the deposited coatings.

According to another aspect, the energetic ion bombardment or plasma etching in the PEPVD is used to smooth/rough and densify the surface of A-coating coated showerhead. The coated showerhead surface can be cleaned by wet solution cleaning in which the erosive solution or slurry or aerosol is used to blast away the surface particles and to control the surface roughness of the coating either on the flat plate or inside the gas holes. The dense coating with the specified roughness could have the fine and compact grain structure with reduced porous volume defects, and thus reduce the plasma erosion rate and maintain clean environment during the plasma etch processes.

To reach performance improved etch processes, the coated showerhead can be formed with modification or combination of the gas distribution plate, showerhead aluminum base and the upper ground ring into one piece of coated showerhead, or the one piece of showerhead with the build-in heater, so that the formation of the new coated showerhead can reduce the production cost and the coated showerhead is easy to be refurbished once it is used for a certain service cycles. In essence, the various parts of the showerhead can be coated so as to be "packaged" by or inside the A-coating layer.

The base or intermediate coating could be of metals, alloys, or ceramics (such as $Y_2O_3$, $YF_3$, $ErO_2$, SiC, $Si_3N_4$, $ZrO_2$, $Al_2O_3$ and their combinations or combination of them with other elements). The second or the top coating with the surface facing the plasma could be A-coating of $Y_2O_3$, $YF_3$, $ErO_2$, SiC, $Al_2O_3$ and their combinations or combination of them with other materials. As quite different from the prior art, it is suggested that the A-coating is deposited on the substrate materials that may have the element(s) and/or component(s) which are also contained in the A-coating, such as the deposition of A-$Y_2O_3$ on anodized surface, $Y_2O_3$ surface, or $Al_2O_3$ surface. Since the same elements or components occurred in both the coating and the substrate will result in the formation of the atomic bondings from the same elements or components in the interfacial region between the A-coating and the substrates, which promotes the formation of A-coating with the increased thickness and the improve adhesion to the substrates or showerhead.

Various methods are disclosed for deposition of A-coating with random crystal orientation and thickness of 50 microns or more, without cracks or delamination. In one embodiment, the surface of the part to be coated is roughened to Ra of 4 microns or more prior to the coating. It was shown that the roughness of 4 micron is critical for reduction of cracks and delamination. Additionally, rather than depositing a single-layer coating to the desired thickness, a series of thinner coatings are deposited, that add up to the desired thickness. For example, if a 50 micron coating of A-$Y_2O_3$ is desired, rather than depositing a single layer, several layers, e.g., five layers of ten microns each are deposited sequentially. Normally, as the thickness of the coating increases, the stress within the coating also increases. However, depositing the coating as a multi-layer structure releases the stress, thus reducing the risk of cracks and delamination.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 9D illustrates another embodiment, wherein the perforated gas plate, conductive ring, and support ring are fabricated as one piece perforated gas distribution plate (or GDP);

FIG. 9E illustrates another embodiment, wherein the showerhead assembly with one piece gas distribution plate is "packaged" in the A-coating; and FIG. 9F illustrates another embodiment, wherein the showerhead assembly with one piece gas distribution plate is coated with an intermediate coating and then with the A-coating.

DETAILED DESCRIPTION

Figure 1:
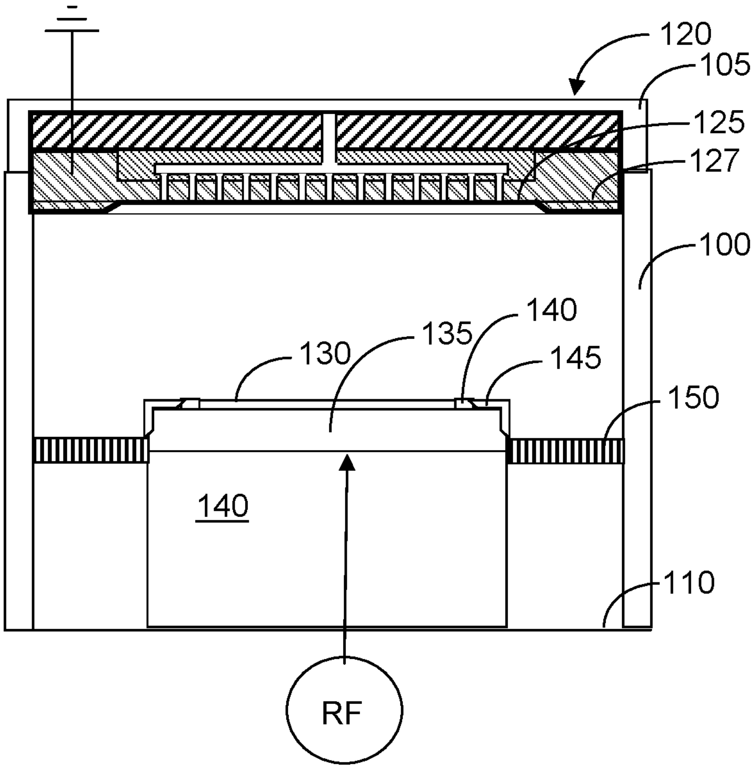
Fig. 1 (PRIOR ART)
FIG. 1 is a schematic of a prior art capacitively coupled plasma chamber.
Figure 2:
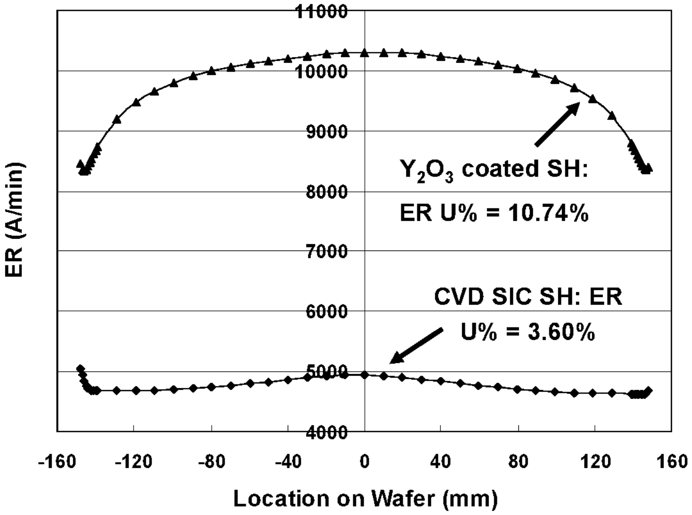
Fig. 2 (PRIOR ART)
FIG. 2 is a plot illustrating etch rate distribution for SiC showerhead and coated showerhead.
Figure 3:
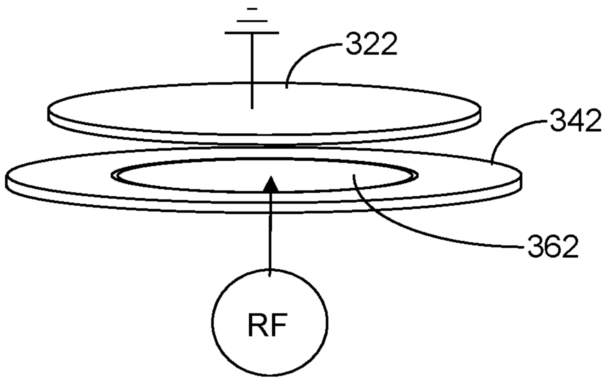
FIG. 3 is a schematic illustrating capacitive coupling of RF power between the showerhead assembly and the bottom electrode assembly.

Various embodiments will now be described, providing improved coatings for showerheads, which improve erosion and particle performance of the showerhead, together with coated cathode assembly for enhancing etch rate and plasma uniformity. FIG. 3 is a schematic illustrating the arrangement for a capacitively coupled plasma chamber. In this embodiment, the top electrode 322 is grounded and the RF power is applied to the bottom electrode, which in this example is composed of electrode 362 and extension 342. The top electrode 322 may be composed of the perforated plate, or a combination of perforated plate and grounding ring. The bottom electrode 362 may be embedded in the chuck, or be part of the pedestal supporting the chuck. The extension 342 may be composed of one or a combination of focus ring, cover ring, flow equivalent ion shied, and/or plasma confinement ring. By proper selection of the elements comprising the upper and lower electrodes, and proper coating of these elements, etch rate can be enhanced without deteriorating etch uniformity. Moreover, coated parts are better protected from plasma corrosion.

For example, in one embodiment the upper electrode is fabricated as a combined showerhead and grounding ring, while the bottom electrode is the combination of the chuck electrode—coupling the power via the silicon wafer, plus an extended electrode that is formed by the coated focus ring, the coated cover ring, and the coated FEIS ring. In this embodiment, the upper electrode is fabricated from SiC or Al alloy, and is coated with $Y_2O_3$. The coating has fine/compact grain structure and random crystal orientation, as will be described in more details below. The extended electrode may be made of conductive material and also has the $Y_2O_3$ coating.

Figure 4:
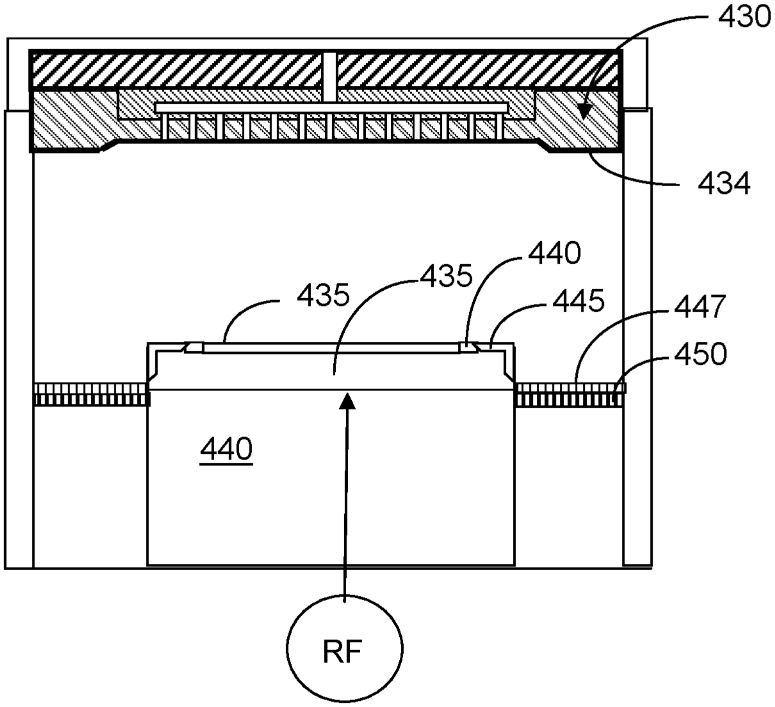
FIG. 4 illustrates a plasma chamber according to one embodiment.

FIG. 4 illustrates an embodiment where the upper electrode is a combined showerhead and grounding ring, illustrated as shower-plate 430. In this embodiment the shower-plate 430 is made of either SiC or Al alloy, and has a protective coating 434. Also, in this embodiment the coating is yttrium-based, such as, e.g., $Y_2O_3$, $Y_2F_3$, etc. For enhanced plasma-corrosion resistance, it is best to coat the showerhead with the advanced coating, as described more fully below.

Also shown in FIG. 4 are focus ring 440, cover ring 445, and plasma confinement ring 450. The plasma confinement ring may include flow equalization ion shied (FEIS) ring 447. The FEIS ring 447 functions to create equivalent flow to the vacuum pump and block ions from flowing into the exhaust path to the vacuum pump. In the embodiment of FIG. 4, at least one of the focus ring 440, cover ring 445, plasma confinement ring 450 and/or flow equivalent ion shied (FEIS) ring 447 is coated with the same coating as the shower-plate 430.

Figure 5:
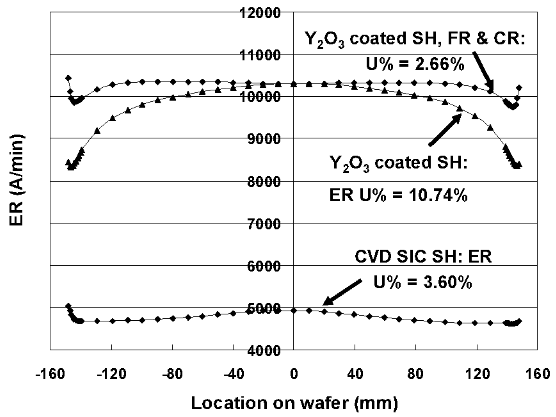
FIG. 5 is a plot demonstrating the effects of having $Y_2O_3$ coated showerhead as upper electrode and $Y_2O_3$ coated focus ring and cover ring as extended lower electrode.
Figure 6:
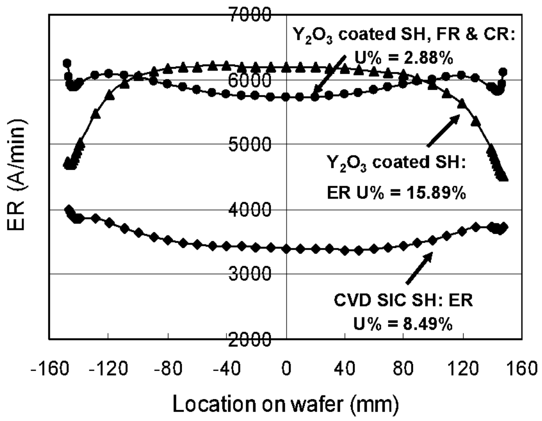
FIG. 6 illustrates the results obtained with the same hardware set-up, but using Recipe 2 in Table 1.

FIG. 5 is a plot demonstrating the effects of having $Y_2O_3$ coated showerhead as upper electrode and $Y_2O_3$ coated focus ring and cover ring as extended lower electrode. Notably, the etch rate is high as for the case where only the showerhead was coated. However, uniformity has improved dramatically to 2.66%. In fact, the uniformity is even better than what it was prior to coating the showerhead. This result was obtained by using the etch recipe indicated as Recipe 1 in Table 1. FIG. 6, on the other hand, illustrates the results obtained with the same hardware set-up, but using Recipe 2 in Table 1. As can be seen by comparing the two plots of FIG. 5 and FIG. 6, the etch rate remains the same, but the etch uniformity can be changed by changing recipe parameters. Note that the uniformity for Recipe 2 is 2.88%, which is better than that uniformity achieved without the coating.

TABLE 1

| Recipe | Pressure mT | 60 MHz Power W | 2 MHz Power W | $CF_4$ | $C_4F_8$ | Ar sccm | $N_2$ | $O_2$ |
|---|---|---|---|---|---|---|---|---|
| No 1 | 90-110 | 1300-1700 | 1600-2000 | 450-500 | | 200-250 | | 75-100 |
| No 2 | 70-90 | 1300-1700 | 2300-2700 | 50-70 | 40-60 | 500-700 | 100-200 | 50-75 |

In the embodiment of FIG. 4, leading to the results plotted in FIGS. 5 and 6, the focus ring was made of SiC or quartz and the cover ring was made of quartz, both of which were coated with $Y_2O_3$. However, according to another embodiment, the both focus ring and cover ring are made using solid $Y_2O_3$. According to this embodiment, the ER uniformity can be improved and the service life of cover ring (CR) and focus ring (FR) can be prolonged.

Figure 7:
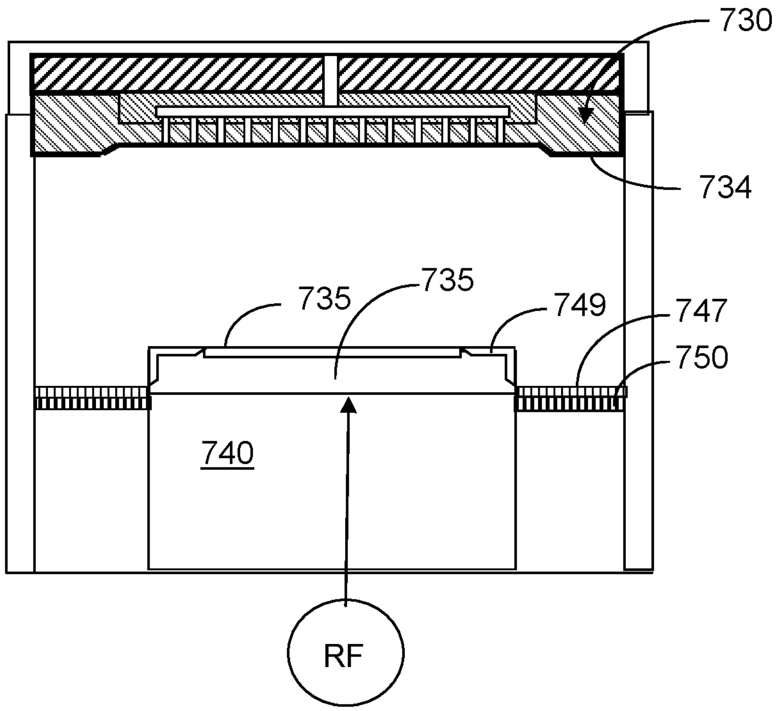
FIG. 7 illustrates a plasma chamber according to another embodiment.

According to another embodiment, illustrated in FIG. 7, the quartz cover ring (CR) and SiC focus ring (FR) are replaced by a one piece composite cover ring 749, that is actually the combination of the original quartz CR and SiC FR. The composite cover ring (CCR) 749 can be made of solid $Y_2O_3$, or other materials, such as but not limited to, Si, SiC, Quartz, $Al_2O_3$ or other plasma resistant ceramics. On the other hand, the one-piece composite cover ring 749 can be made of materials, such as, but not limited to, Si, SiC, $Y_2O_3$, Quartz, $Al_2O_3$ and other ceramics, and include a plasma resistant coating. The plasma resistant coatings can be, such as, but not limited to, $Y_2O_3$, $YF_3$, $ErO_2$, SiC, $Si_3N_4$, $ZrO_2$, $Al_2O_3$ and their combinations, or a combination of them with other elements. The selection and deposition of different coatings on the composite cover ring highly depends on the combinations of the materials that are used to form the upper electrode and the bottom electrode. The use of such one-piece cover ring 749 reduces the production cost, but keeps the benefits of etch rate and etch uniformity.

According to one specific another embodiment, the composite cover ring 749 is made by the deposition of $Y_2O_3$ coatings onto $Al_2O_3$ substrate. Comparing the properties of other materials list in Table 2, $Al_2O_3$ has coefficient of thermal expansion (CTE) that is almost the same as that of $Y_2O_3$. This property ensures that thick $Y_2O_3$ coating can be synthesized on the $Al_2O_3$ surface, with a stable structure and the good adhesion. The combination can also withstand operating in high service temperatures. Additionally, the $Al_2O_3$ based composite cover ring (CCR) will have enhanced service function in various plasma environments, as $Al_2O_3$ substrate has good thermal conductivity, comparing to solid $Y_2O_3$ CCR.

TABLE 2

| | Materials | | | | |
|---|---|---|---|---|---|
| | PS $Y_2O_3$ | Si | SiC | $Al_2O_3$ | Al |
| CTE, 10−6 · K−1 | 5.9 | 2.6-3.2 | 2.9-3.2 | 5.4 | 20 |
| Thermal conductivity, W · m−1 · K−1 | 3.8 | 149 | 150 | 30 | 125 |

As can be understood from the embodiments disclosed above, when providing $Y_2O_3$ coated FR, $Y_2O_3$ coated CR, and/or $Y_2O_3$ coated FEIS ring, which aren't grounded, i.e., being floating or RF biased, they function as an extended bottom electrode. When the plasma is ignited and maintained between bottom electrode, i.e., the combined electrostatic chuck and wafer, and upper electrode $Y_2O_3$ coated SH, the plasma is also simultaneously ignited and maintained between the upper electrode $Y_2O_3$ coated SH and the extended bottom electrode, i.e., the $Y_2O_3$ coated FR, the $Y_2O_3$ coated CR, and the $Y_2O_3$ coated FEIS ring. Since the upper electrode and the extended bottom electrode have the $Y_2O_3$ surfaces, it helps to stable the RF coupling and maintain uniform plasma distribution between the CCP electrodes and thus promote the uniform plasma etch on the wafer's surface. It is noted that in the embodiment of FIG. 3, the diameter of the extended bottom electrode is larger than the diameter of the showerhead.

The description now turns to the apparatus and method for forming the coating, which may be used to coat the showerhead and the extended bottom electrode described above.

Unlike conventional plasma spray, in which the coating is deposited in atmospheric environment, the advanced coating disclosed herein is deposited in low pressure or vacuum environment. Also, while in plasma spray the coating is deposited using small powdery particles, the advanced coating is deposited by the condensation of atoms, radicals, or molecules on the materials surfaces. Consequently, the characteristics of the resulting coating layer is different from the prior art coating, even when the same material composition is used. For example, it was found that a $Y_2O_3$ coating deposited according to embodiment of the invention has practically no porosity, specified surface roughness above 1 um, and has a much higher etch resistance than the conventional PS $Y_2O_3$ coating.

Figure 8:
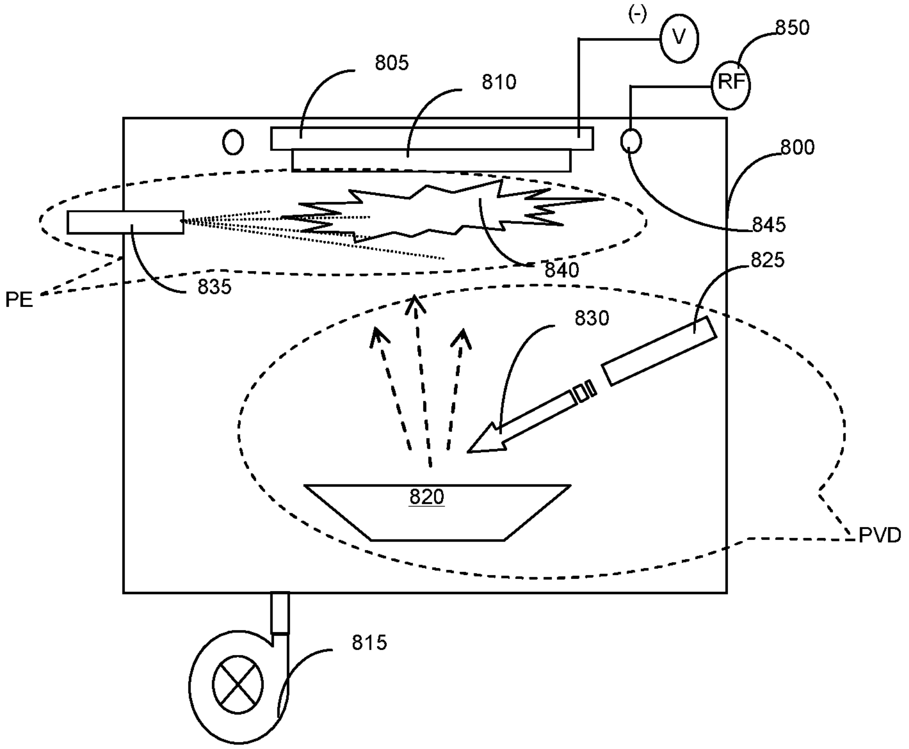
FIG. 8 illustrates an apparatus for depositing advanced coating in accordance with one embodiment of the invention.

The embodiments of the invention will now be described in detail with reference to the Figures. First, the equipment and method for depositing the advanced coating will be described. FIG. 8 illustrates an apparatus for depositing advanced coating in accordance with one embodiment of the invention. This apparatus is used for depositing the advanced coating using the process referred to herein as PEPVD, where the PE and PVD components are highlighted by the broken-line callouts in FIG. 8. Traditionally, chemical vapor deposition (CVD) or plasma enhanced chemical vapor deposition (PECVD) refer to a chemical process where a thin film is formed on the substrate's surface by exposing the substrate to one or more volatile precursors, which react and/or decompose on the substrate surface to produce the desired deposited film. PVD, on the other hand, refers to a coating method which involves purely physical processes, where thin films are deposited on the surface of the substrate by the condensation of a vaporized or sputtered form of the desired film materials that can be usually the solid source materials. Therefore, one may characterize PEPVD as somewhat of a hybrid of these two processes. That is, the disclosed PEPVD involves both physical process of atom, radicals, or molecular condensation (the PVD part) and plasma induced chemical reaction in the chamber and on the substrate's surface (the PE part).

In FIG. 8, chamber 800 is evacuated by vacuum pump 815. The part 810 to be coated, in this example the showerhead, focus ring, cover ring, confinement ring, etc., is attached to a holder 805. Also, a negative bias is applied to the part 810, via holder 805.

A source material 820 containing species to be deposited is provided, generally in a solid form. For example, if the film to be deposited is $Y_2O_3$ or $YF_3$ based, source material 820 would include yttrium (or fluorine)—possibly with other materials, such as oxygen, fluorine (or yttrium) etc. To form the physical deposition, the source material is evaporated or sputtered. In the example of FIG. 8, the evaporation is achieved using electron gun 825, directing electron beam 830 onto the source material 820. As the source material is evaporated, atoms and molecules drift towards and condense on the part 810 to be coated, as illustrated by the broken-line arrows.

The plasma enhanced part is composed of a gas injector 835, which injects into chamber 800 reactive and non-reactive source gases, such as argon, oxygen, fluorine containing gas, etc., as illustrated by the dotted lines. Plasma 840 is sustained in front of part 810, using plasma sources, e.g., RF, microwave, etc., one of which in this example is shown by coil 845 coupled to RF source 850. Without being bound by theory, it is believed that several processes take place in the PE part. First, non-reactive ionized gas species, such as argon, impinging the part 810, so as to condense the film as it is being "built up." The effects of ion impinging may result from the negative bias on part 810 and part holder 805, or from the ions emitted out from the plasma sources and aimed at part 805. Second, reactive gas species or radicals, such as oxygen or fluorine, react with the evaporated or sputtered source material, either inside the chamber or on the surface of the part 810. For example, the source Yttrium reacts with the oxygen gas to result in Y containing coating, such as $Y_2O_3$ or $YF_3$. Thus, the resulting process has both a physical (impingement and condensation) component and a chemical component (e.g. oxidation and ionization).

Figure 9A:
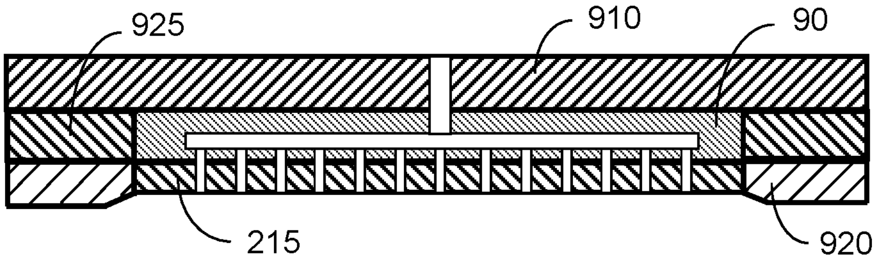
Fig. 9A (PRIOR ART)
FIG. 9A illustrates a conventional showerhead and electrode assembly for a plasma chamber.

FIG. 9A illustrates a conventional showerhead and electrode assembly for a plasma chamber. Conductive plate 905, sometimes, can be converted as the heater to control the temperature of the showerhead, is sandwiched between back plate 910 and perforated gas plate 915. Conductive ring 920 surrounds the perforated gas plate 915 and can work as the extended upper electrode or as a grounding ring. Support ring 925 surrounds conductive plate 905 and is also sandwiched between conductive ring 920 and back plate 910. Perforated gas plate 915, actually working as a gas distribution plate (or GDP), may be made of ceramic, quartz, etc., for example, it may be made of silicon carbide, and may be assembled to the lower surface of conductive plate 905. Conductive ring 920 may be made of ceramic, quartz, etc., for example, it may be made of silicon carbide, and may be assembled to the lower surface of support ring 925. The support ring 925, the conductive plate 905 and the back plate 910 may be made of metal and alloy, e.g., aluminum, stainless steel, etc. The showerhead is affixed to the ceiling of the plasma chamber, in a well-known manner.

Figure 9B:
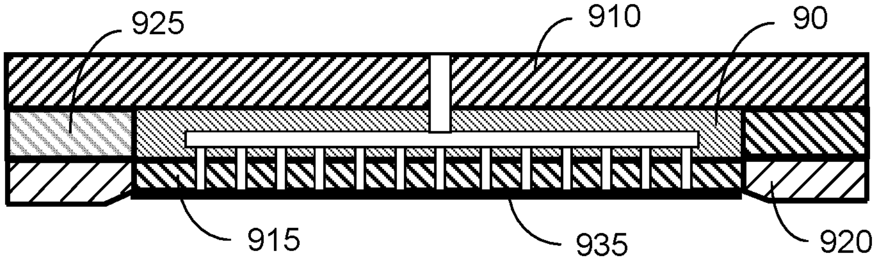
FIG. 9B illustrates a showerhead having generally the same structure as that of FIG. 9A, except that it includes the advance coating according to an embodiment of the invention.

FIG. 9B illustrates a showerhead having generally the same structure as that of FIG. 9A, except that it includes the advance coating according to an embodiment of the invention. In FIG. 9B the advanced coating 935 (for example, A-$Y_2O_3$) is provided on the bottom surface of the perforated gas plate 915, i.e., the surface that faces the plasma during substrate processing. The advanced coating 935 may be the single layer or the multilayered coatings. In this embodiment, the perforated gas plate is fabricated according to standard procedures, including formation of gas injection holes/perforations. Then, the plate is inserted into a PEPVD chamber and the bottom surface is coated with advanced coating. Since the PEPVD coating uses atoms or molecules for buildup of the coating, the interior of the gas injection holes is also coated. However, unlike prior art coating, the advance coating is formed by the condensation of atoms and molecules, and results in a dense and uniform A-coating with the good adhesion to the interior surface of the gas holes, thereby providing smooth gas flow and avoiding any particle generation.

While according to above embodiment the surface of the coated perforated gas plate is characterized with the specified surface roughness (surface roughness is controlled equal to or larger than Ra 1.0 um), according to one embodiment the surface is roughened in order to promote polymer adhesion during plasma processing. That is, according to one aspect, the surface roughness of the A-coating is controlled, since if the surface is too smooth, polymer deposition during etching will not adhere well to the surface, and thus induce particles. On the other hand, too rough surface will directly create particles due to the plasma etching. Therefore, according to this embodiment the recommended surface roughness Ra is equal to or above 1 um. Perfectly, the recommended surface roughness Ra is above 1 um, but below 10 um (1 um<Ra<10 um). It has been found that in this range the particle generation is minimized, while polymer adhesion is controlled. That is, the noted range is critical because using higher roughness leads to particle generation, while using smoother coating diminishes adhesion of the polymers during plasma processing. In all cases, the A-coating with either single or multilayered structure has the dense structure with random crystal orientation and porosity less than 1% and has no any crack or delamination.

According to one embodiment this roughness is achieved by the as-deposited coating, or by lapping, polishing or other post PEPVD surface treatment on the as-deposited coatings. On the other hand, according to one embodiment the surface of the perforated gas plate is first roughened to the desired roughness (Ra>4 um), and then the coating is deposited. Since the coating is done using PEPVD, the resulting coating may have the same or different roughness as the surface prior to the coating, according to the thickness of the coating and the deposition process.

Figure 9C:
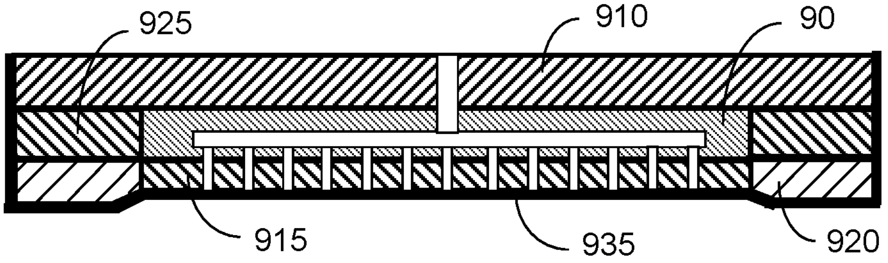
FIG. 9C illustrates another embodiment, wherein the showerhead assembly has one piece gas distribution plate that is "packaged" in the A-coating.

FIG. 9C illustrates another embodiment, where the showerhead assembly is "packaged" in the A-coating. That is, as shown in FIG. 9C, the lower surface of the entire showerhead assembly is coated with the A-coating 935 (for example A-$Y_2O_3$). In this example, various parts forming the showerhead are first assembled, and then are positioned inside the PEPVD chamber to form the advanced coating over the lower surface of the entire assembly. In this manner, the showerhead assembly is "packaged" by the advanced coating and is fully protected from plasma erosion. As discussed with reference to FIG. 9B, the surfaces may remain smooth, or may be roughened so as to promote polymer adhesion. In all cases, however, the coating thickness is above 50 um.

FIG. 9D illustrates another embodiment, where the perforated gas plate 915, conductive ring 920 and support ring 925 in former embodiments are united as one piece perforated gas plate (or GDP) 915 in this embodiment. As quite different from the prior art, the one piece perforated gas plate 915 can be made of metals, for instance, Al alloy, and the surface can be protected by the deposition of A-coatings 935, such as A-$Y_2O_3$. As comparing to the prior art, the formation of showerhead by A-$Y_2O_3$ coating 935 over the perforated gas plate 915 can reduce the product cost, simplifies the assembly and manufacture procedure of shower head, and increase the work life time. Another advantage is that it provides the possibility to refurbish the used showerhead simply by the re-deposition of A-coating 935 over the one piece perforate gas plate 915. In addition, it is more easy to form the A-coating "packaged" showerhead, as again another embodiment showing in FIG. 9E, since the deposition of A-coating is carried out on the showerhead that formed only by the assembly of the one piece perforated gas plate 915 to the conductive plate 905 and back plate 910.

FIG. 9F illustrates yet another embodiment of the invention. FIG. 9F is drawn as a callout from FIG. 9E to indicate that it depicts an enlarge section of a showerhead similar to that shown in FIG. 9E, except that it has a different coating scheme. In the embodiment of FIG. 9F, the perforated gas plate 915 has an intermediate layer or coating 913. The intermediate layer is formed on the roughened surface of the perforate gas plate 915, and the surface of the intermediate layer where the A-coating is deposited thereon also has a roughened surface. The intermediate layer may be, for example, an anodized layer or a plasma sprayed $Y_2O_3$ coating. Then an advanced coating 935, according to any of the embodiments described herein, is deposited as a single layer or multi-layered structure over the intermediate layer or coating 913. Moreover, each of the A-coating 935 and the intermediate layer 913 can be formed as the multi-layered coatings, so that the thickness of the coating can be increased and the structure stability of the deposited coatings can be improved.

According to one example, the perforated gas plate is the anodized plate where the surface and inside gas holes are all protected by the anodization, such as the hard anodization. Then, the deposition of A-coatings, such as A-$Y_2O_3$ is performed either on the surfaces of perforate gas plate (expect the back side surface contact to the conductive plate 905 and back plate 910) as showing in FIG. 9D or on the surface of the assembled showerhead as showing in FIG. 9E. Since the deposition of A-coating is directly on the anodized surface, there is no interfacial issue between A-coating and anodization, which usually exists between the PS $Y_2O_3$ coating and the anodized surface as the PS $Y_2O_3$ is normally deposited on the bare Al alloy, to reach a good adhesion of PS $Y_2O_3$ coating to the chamber parts.

According to various embodiments, the intermediate layer or coating could be of metals, alloys, or ceramics (such as $Y_2O_3$, $YF_3$, $ErO_2$, SiC, $Si_3N_4$, $ZrO_2$, $Al_2O_3$, AlN and their combinations or combination of them with other elements). The second or the top coating with the surface facing to plasma is the A-coating of $Y_2O_3$, $YF_3$, $ErO_2$, SiC, $Al_2O_3$ and their combinations or combination of them with other materials.

As quite different from the prior art, according to some embodiments the A-coating is proposed to be deposited on the substrate materials that could have at least one element or component which is also contained in the A-coating, such as the deposition of A-$Y_2O_3$ on anodized surface, $Al_2O_3$ or $Y_2O_3$ surface. Since the same elements or components occurred in both the coating and the substrate will result in the formation of the atomic bonding from the same elements or components in the interfacial region between the A-coating and the substrates, which promotes the formation of A-coating with the increased thickness and the improve adhesion to the substrates or showerhead.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A method for fabricating a showerhead for a plasma processing chamber, comprising:

fabricating a showerhead assembly, the showerhead assembly comprising a perforated plate, wherein the fabricating the showerhead assembly comprises fabricating a shower-plate including a combination of the perforated plate and a grounding ring made of SiC;

roughening a surface of the perforated plate by forming a first layer coating on the perforated plate with a surface roughness Ra of the first layer coating to be above 5 microns;

placing a source material containing Yttrium in a vacuum chamber;

placing the perforated plate with the first layer coating in the vacuum chamber by attaching the perforated plate to a holder; directing electron beam from an electron gun at the source material thereby evaporating or sputtering the source material to perform physical vapor deposition of the source material over the first layer coating on the perforated plate;

injecting a source gas including reactive gases and non-reactive gases including argon containing gas into a vacuum chamber;

applying RF power from an RF source to a coil positioned within the vacuum chamber thereby igniting plasma inside the vacuum chamber in front of the perforated plate, such that the plasma surrounds a surface of the perforated plate, and thereby generating non-reactive argon gas species;

applying a negative bias from voltage source to the perforated plate, via the holder, to cause the non-reactive argon gas species to impinge upon on the surface of the perforated plate;

condensing the evaporated or sputtered source material during the physical vapor deposition of the source material on the perforated plate as a second layer coating is being building up by a condensation of the evaporated or sputtered source material;

forming the second layer coating containing Yttrium on the perforated plate based on the condensation of the evaporated or sputtered source material and a chemical reaction of the source material with the reactive gases, wherein the second layer coating is formed as a multi-layered structure comprising a plurality of sequentially deposited layers having a total thickness above 50 microns without cracks or delamination, and wherein the second layer coating coats interior surfaces of gas injection holes of the perforated plate; and performing a surface treatment including lapping on the second layer coating to form a surface roughness Ra above 2 microns, but below 10 microns.

2. The method of claim 1, wherein fabricating the showerhead assembly comprises fabricating the perforated plate from SiC.

3. The method of claim 1, wherein fabricating the showerhead assembly comprises fabricating the perforated plate from Al alloy.

4. The method of claim 1, wherein fabricating the showerhead assembly comprises fabricating an integrated perforated plate and grounding ring.

5. The method of claim 1, further comprising anodizing the perforated plate prior to placing the perforated plate in the vacuum chamber.

6. The method of claim 1, wherein the injecting the source gas comprises injecting at least one of argon, oxygen, or fluorine.

7. The method of claim 1, wherein the fabricating the showerhead assembly further comprises:

fabricating a back plate, a support ring and a conductive ring;

assembling the perforated plate, the back plate, the support ring, and the conductive ring to form the showerhead assembly;

and wherein placing the perforated plate in the vacuum chamber comprises placing the perforated plate assembled into the showerhead assembly, such that forming the protective coating packages an assembled showerhead assembly.

8. The method of claim 1, wherein the source gas comprises oxygen containing gas, thereby forming a protective coating of Yttria.

9. The method of claim 1, wherein the source gas comprises fluorine containing gas, thereby forming a protective coating of YF3.

10. The method of claim 1, wherein the injecting the source gas comprises injecting argon and a reactive gas selected from oxygen and fluorine.

11. The method of claim 1, further comprising forming an intermediate coating on the perforated plate prior to placing the perforated plate in the vacuum chamber, wherein the intermediate coating contains aluminum or yttrium.

12. The method of claim 11, wherein the intermediate coating comprises plasma sprayed Y2O3 coating.

13. The method of claim 1, further comprising:

fabricating a focus ring, a cover ring, and a plasma confinement ring;

placing at least one of the focus ring, the cover ring, or the plasma confinement ring in the vacuum chamber;

evaporating or sputtering the source material to perform physical vapor deposition of the source material on the at least one of the focus ring, the cover ring, or the plasma confinement ring;

injecting the source gas into the vacuum chamber;

igniting plasma inside the vacuum chamber in front of the at least one of the focus ring, the cover ring, or the plasma confinement ring; and forming a protective coating containing Yttrium on the at least one of the focus ring, the cover ring, or the plasma confinement ring.

14. The method of claim 13, wherein fabricating the focus ring and the cover ring comprises fabricating a single-piece composite cover ring.

15. The method of claim 14, wherein the fabricating the single-piece composite cover ring comprises fabricating the single-piece composite cover ring from $Al_2O_3$.

16. The method of claim 15, further comprising coupling the single-piece composite cover ring to RF power supplier to form an extended electrode.

17. The method of claim 1, wherein a process is controlled to generate a protective coating having random crystal orientation and porosity less than 1%.

18. The method of claim 1, whereon the showerhead assembly defines a first diameter, and further comprising fabricating an extended bottom electrode defining a second diameter larger than the first diameter of the showerhead assembly and forming a protective coating containing Yttrium on the extended bottom electrode.

* * * * *